United States Patent [19]

Yonehara

[11] Patent Number: 5,254,211

[45] Date of Patent: Oct. 19, 1993

[54] METHOD FOR FORMING CRYSTALS

[75] Inventor: Takao Yonehara, Atsugi, Japan

[73] Assignee: Canon Kabushiki Kaisha, Tokyo, Japan

[21] Appl. No.: 759,768

[22] Filed: Sep. 13, 1991

Related U.S. Application Data

[63] Continuation of Ser. No. 501,436, Mar. 22, 1990, abandoned, which is a continuation of Ser. No. 174,382, Mar. 28, 1988, abandoned.

[30] Foreign Application Priority Data

Mar. 27, 1987 [JP] Japan .................. 62-73605

[51] Int. Cl.$^5$ .............................................. C30B 19/06
[52] U.S. Cl. ............................... 156/621; 156/622; 156/624; 156/DIG. 69; 156/DIG. 98; 437/241
[58] Field of Search ........ 156/621, 622, 624, DIG. 64, 156/DIG. 98; 148/DIG. 101; 437/241

[56] References Cited

U.S. PATENT DOCUMENTS

| | | | |
|---|---|---|---|
| 3,341,361 | 9/1967 | Gorski | 156/DIG. 64 |
| 3,993,533 | 11/1976 | Milnes | 156/624 |
| 4,077,817 | 3/1979 | Bellavance | 156/624 |
| 4,211,821 | 7/1980 | Hadni | 156/621 |
| 4,251,299 | 2/1981 | Baliga et al. | 156/624 |
| 4,371,421 | 2/1983 | Fan et al. | 156/624 |
| 4,547,230 | 10/1985 | Hawrylo | 148/171 |
| 4,549,913 | 10/1985 | Hayafuji et al. | 156/624 |

FOREIGN PATENT DOCUMENTS

| | | |
|---|---|---|
| 0180751 | 9/1985 | European Pat. Off. |
| 0244081 | 3/1987 | European Pat. Off. |
| 49-34269 | 9/1974 | Japan ............ 136/624 |

OTHER PUBLICATIONS

1046 Journal of the Electrochemical Society, 132, (1985), Nov., No. 11, Manchester, N.H., U.S.A., "Lateral Epitaxial Growth over Oxide" by L. O. Wilson et al.

Brit. J. Appl. Phys., 1967, vol. 18, "Single-Crystal Films of Silicon on Insulators" by J. D. Filby et al.

Thin Solid Films, 124, (1985), 3–10, "Substrate Preparation for Thin Film Deposition—A Survey" by D. M. Mattox.

Japanese Journal of Applied Physics, vol. 16, No. 12, Dec. 1977, pp. 2109–2113.

Girault et al., "Liquid Phase Epitaxy of Silicon at Very Low Temperatures", Journal of Crystal Growth, vol. 37, (1977), pp. 169 to 177.

*Primary Examiner*—Robert Kunemund
*Attorney, Agent, or Firm*—Fitzpatrick, Cella, Harper & Scinto

[57] ABSTRACT

A method of forming a crystal comprises a crystal forming treatment effected by dipping a substrate having a nonnucleation surface having a small nucleation density and a nucleation surface having a larger nucleation density than said nonnucleation surface and an area sufficiently fine to such an extent as to allow only a single nucleus to be formed in a solution containing a monocrystal forming material to thereby allow a monocrystal to grow from only the single nucleus.

13 Claims, 12 Drawing Sheets

METHOD FOR FORMING CRYSTALS

This application is a continuation of application Ser. No. 07/501,436 filed Mar. 22, 1990, now abandoned, which is a continuation of application Ser. No. 07/174,382 filed Mar. 28, 1988, now abandoned.

BACKGROUND OF THE INVENTION

1. Field of the Invention

This invention relates to a method of forming crystals, particularly to the method of forming crystals by utilizing the difference in nucleation density in liquid phase.

The present invention may be applied for formation of crystals including monocrystals, polycrystals, etc. to be used for, for example, electronic devices, optical devices, magnetic devices, piezoelectric devices or surface acoustic devices, etc. of semiconductor integrated circuit, optical integrated circuit, magnetic circuit, etc.

2. Related Background Art

In the prior art, monocrystalline thin films used for semiconductor electronic devices, optical devices, etc. have been formed by epitaxial growth on a monocrystalline substrate. For example, on a Si monocrystalline substrate (silicon wafer), Si, Ge, GaAs, etc. have been known to be epitaxially grown from liquid phase, gas phase or solid phase, and also on a GaAs monocrystalline substrate, monocrystals of GaAs, GaAlAs, etc. have been known to be epitaxially grown.

Particularly, when Si is epitaxially grown from liquid phase onto Si monocrystal, a solution comprising Si which is the depositing material dissolved in Ga, In, Sb, Bi, Sn, etc. as the solvent is used.

Concerning such Si epitaxial growth, there are reports in many literatures as shown below.

B. Girault, F. Chevrier, A. Joulle and G. Bougnot, J. Crystal Growth 37, 169 (1977);

D. Kass, M. Warth, W. Appel, H. P. Strunk and E. Bauser, Electrochemical Society, Meeting 1985;

B. J. Baliga, Journal of Electrochemical Society, vol. 126, P. 138, 1979

B. J. Baliga, Journal of Electrochemical Society, vol. 124, P. 1627, 1977;

B. J. Baliga, Journal of Crystal Growth, vol, 41, P. 199, 1977;

B. J. Baliga, Journal of Electrochemical Society, vol. 125, P. 598, 1978.

All of the above literatures use liquid phase epitaxial growth on monocrystalline Si substrates, not on other materials than monocrystalline Si substrates such as amorphous $SiO_2$.

By use of semiconductor thin films thus formed, semiconductor devices and integrated circuits, and emission devices such as semiconductor lasers, LED, etc. are prepared.

Also, in recent years, research and development have been abundantly conducted on ultra-high speed transistors by use of two-dimensional electron gas, superlattice device utilizing quantum well, etc., and these have been made possible by high precision epitaxial technique such as MBE (molecular beam epitaxy) by use of ultra-high vacuum, MOCVD (metal organic chemical vapor deposition), etc.

In such epitaxial growth on a monocrystalline substrate, it is required to adjust the lattice constant and coefficient of thermal expansion between a monocrystalline material of the substrate and an epitaxial growth layer. For example, although it is possible to grow epitaxially a Si monocrystalline thin film on sapphire which is an insulating monocrystalline substrate, the crystal lattice defect at the surface due to deviation in lattice constant and diffusion of aluminum which is the component of sapphire into the epitaxial layer, etc. are becoming problems in application to electronic devices or circuits.

Thus, it can be understood that the method of forming a monocrystalline thin film of the prior art according to epitaxial growth depends greatly on its substrate material. Mathews et al. examined the combinations of the substrate materials with the epitaxial growth layers (EPITAXIAL GROWTH, Academic Press, New York, 1975 ed. by J. W. Mathews).

Also, the size of the substrate is presently about 6 inches for Si wafer, an enlargement of GaAs, sapphire substrate has been further delayed. In addition, since the production cost of a monocrystalline substrate is high, the cost per chip becomes high.

Thus, for forming a monocrystalline layer capable of preparing a device of good quality according to the process of the prior art, there has existed a problem in that the kinds of the substrate material are limited to an extremely narrow scope.

On the other hand, in recent years, research and development has been extensively done on the three-dimensional integrated circuits formed by laminating semiconductor devices in the normal direction of a substrate to achieve a highly integrated and polyfunctional state. Research and development is also extensively being made year by year on large area semiconductor devices in which elements are set in an array on an inexpensive glass, such as solar batteries and switching transistors for liquid crystal picture elements.

What is common to such research and development is that they require techniques by which a semiconductor thin film is formed on an amorphous insulating material and an electronic device such as a transistor is formed thereon. Particularly sought after among these is a technique by which a monocrystalline semiconductor of high quality is formed on an amorphous insulating material.

In general, however, the deposition of a thin film on the amorphous insulating material such as $SiO_2$ may generally make amorphous or polycrystalline the crystalline structure of the deposited film because of lack of long-distance order of the substrate material. Here, the amorphous film refers to a film kept in a state that the short-distance order as in most vicinal atoms is retained but there is no long-distance order beyond that, and the polycrystalline film refers to a film in which monocrystalline grains having no particular crystal direction have gathered together separated at the grain boundaries.

For example, when Si is formed on $SiO_2$ by the CVD method, if the deposition temperature is about 600° C. or lower, an amorphous silicon is formed, while at a temperature higher than that, a polycrystalline silicon with grain sizes distributed between some hundred to some thousand Å is formed. However, the grain size and its distribution will vary greatly depending on the formation method.

Further, a polycrystalline thin film with a large grain size of about micron or millimeter is obtained by melting and solidifying an amorphous or polycrystalline film with an energy beam such as laser, rod-shaped heater, etc. (Single-Crystal silicon on non-single-crystal insulators, Journal of Crystal Growth vol. 63, No. 3, October, 1983, edited by G. W. Cullen).

When transistors are formed on thin films of various crystal structures thus formed, and electron mobility is measured from its characteristics, a mobility of ca. 0.1 cm$^2$/V.sec is obtained for amorphous silicon, a mobility of 1 to 10 cm$^2$/V.sec for a polycrystalline silicon having a grain size of some hundred Å, and a mobility to the same extent as in the case of monocrystalline silicon for a polycrystalline silicon with a large grain size by melting and solidification.

From these results, it can be understood that there is great difference in electrical characteristics between the device formed in the monocrystalline region within the crystal grain and the device formed as crossing over the grain boundary. In other words, the deposited film on the amorphous material becomes amorphous or a polycrystalline structure and the device prepared there is greatly inferior in performance as compared with the device prepared in the monocrystalline layer. For this reason, uses are limited to simple switching device, solar battery, photoelectric converting device, etc.

Also, the method for forming a polycrystalline thin film with a large grain size by melting and solidification had the problem that enormous time is required for making grain size larger, because an amorphous or monocrystalline thin film is scanned with an energy beam for each wafer, whereby bulk productivity is poor and the method is not suited for enlargement of area.

As described above, in the method of growing crystals of the prior art and the crystals formed thereby three-dimensional integration or enlargement of area cannot be easily conducted to devices for practical applications whereby crystals such as monocrystals and polycrystals required for preparation of a device having excellent characteristics could not be formed easily and at low cost.

SUMMARY OF THE INVENTION

An object of the present invention is to solve the above problems of the prior art as described above, and also provide a method which can prepare crystals of good quality such as monocrystals containing no grain boundary and polycrystals controlled in grain boundary, etc. without restriction to the base materials, for example, without restriction to the material, the constitution, the size, etc. of the substrate, and in particular a method of forming the above crystals by the simple steps with good efficiency without using a special device.

Another object of the present invention is to provide a method of forming a crystal which comprises a crystal forming treatment effected by dipping a substrate having a nonnucleation surface having small nucleation density and a nucleation surface having a larger nucleation density than said nonnucleation surface and an area sufficiently fine to such an extent as to allow only a single nucleus to be formed in a solution containing a monocrystal forming material to thereby allow a monocrystal to grow from only the single nucleus.

DESCRIPTION OF THE PREFERRED EMBODIMENTS

First, to get better understanding of the present invention, the selective deposition method for forming selectively a deposited film on the deposition surface is to be described. The selective deposition method is a method in which a thin film is selectively formed on the portion of the substrate having a high nucleation density by utilizing the difference between the materials in the factors influencing nucleation in the thin film forming process such as surface energy, attachment coefficient, elimination coefficient, surface diffusion speed, etc.

Figure 14A:
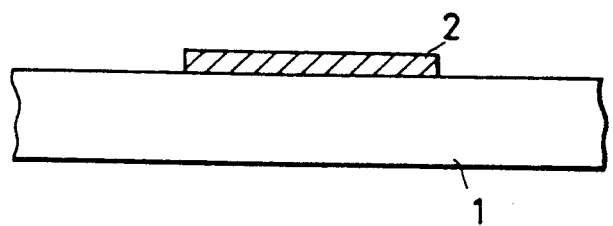
FIGS. 14A and 14B are diagrams for illustration of the selective deposition method.
Figure 14B:
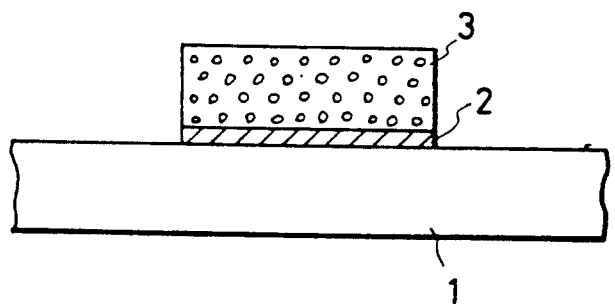

FIGS. 14A and 14B illustrate schematically the selective deposition method. First, as shown in FIG. 14A, on the substrate 1, a thin film 2 comprising a material different in the above factors from the substrate 1 is formed at a desired portion. When deposition of a thin film 3 comprising an appropriate material is performed on the surface of the thin film 2 according to appropriate deposition conditions, it becomes possible to cause a phenomenon to occur such that the thin film 3 will grow only on the thin film 2 without growth on the substrate 1.

In the following, various embodiments of the present invention are described in detail with reference to the attached drawings.

The present invention utilizes the aforementioned difference of nucleation density, and forms a nucleation surface with a different material having a sufficiently larger nucleation density than the material constituting a nonnucleation surface sufficiently finely to such an extent as to allow only a single nucleus to grow thereon, thereby performing the selective growth of a monocrystal only on the fine nucleation surface from the single nucleus formed thereon.

As the materials which can be utilized in the present invention, there may be included, for example, SiO$_x$ ($0 < x \leq 2$) as the material of the nonnucleation surface, Si, GaAs, silicon nitride as the materials of nucleation surface, and Si, W, GaAs, InP, etc. as the monocrystalline materials to be allowed to grow.

For example, by selecting $SiO_2$ as the constitutional material of the nonnucleation surface and silicon nitride as the constitutional material of the nucleation surface while selecting silicon as the monocrystalline material to be allowed to grow, sufficiently great nucleation density difference can be obtained.

Of course, the present invention is not limited by these materials, but the nucleation density difference may be sufficiently $10^2$-fold or more in terms of the density of nucleus, and sufficient selective formation of a monocrystalline deposited film can be performed with the materials as exemplified below.

As another method for obtaining such nucleation density difference, a region containing excessive amounts of N, etc. may be also formed by ion implantation of Si, N, etc. locally on the $SiO_2$ film.

Since the selective growth of monocrystal is determined depending on the electron state of the nucleation surface, particularly the state of dangling bond, the material forming nucleation surface with lower nucleation density (e.g. $SiO_2$) is not required to be a bulk material, but the nucleation surface may be formed only on the surface of the substrate of any desired material.

In the present invention the selective monocrystal forming method as described above is practiced in liquid phase containing materials for formation of monocrystals. A solution containing a depositing material for preparing monocrystals dissolved in an appropriate solvent is prepared. The substrate for formation of monocrystals is then dipped into said solution supersaturated with the depositing material.

When Si is the depositing material, Ga, In, Sb, Bi, Sn, etc. is used as the above solvent.

Figure 1:
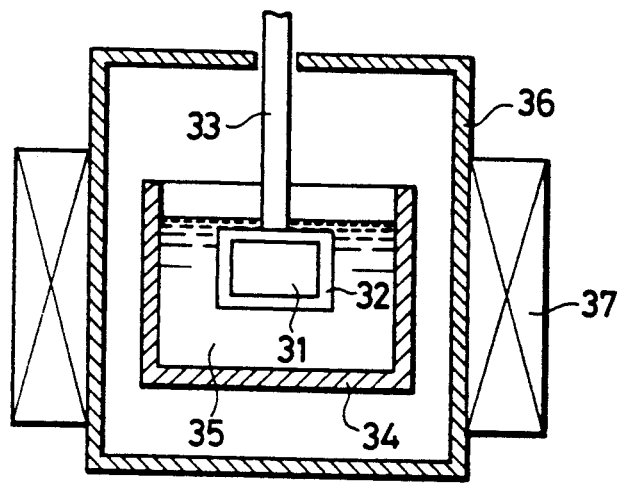
FIG. 1 is a schematic constitutional view showing an example of the device to be used for practicing the method of the present invention.

FIG. 1 is a schematic constitutional view showing an example of the device to be used for practicing the selective monocrystal forming method in liquid phase of the present invention.

In the FIG. 31 is a substrate to allow selective monocrystal formation on its surface, and said substrate 31 is held by fixing with a substrate holder 32, and said substrate holder 32 is suspended from above by a substrate supporting rod 33. 34 is a crucible and the above solution 35 is housed in said crucible. The above members are arranged in the treatment chamber 36, and a heater 37 is arranged around said treatment chamber.

During the selective deposition, with the substrate 31 being dipped into the above solution 35, the treatment chamber 36 is internally heated to an appropriate temperature with the heater 37 and gradually cooled at an appropriate speed. By this process, selective formation of monocrystals is gradually performed while maintaining the state of the solution 35 as super-saturated with the depositing material.

Figure 3A:
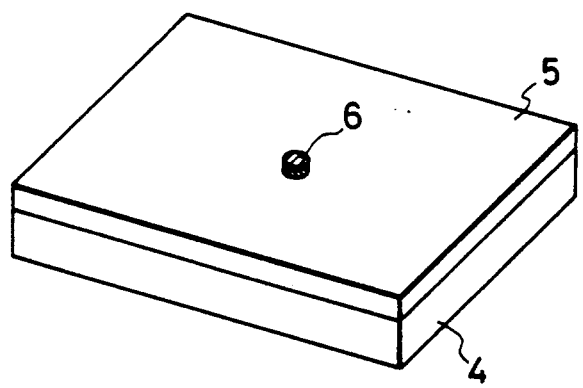
FIGS. 3A and 3B are perspective views of FIGS. 2A and 2D.
Figure 3B:
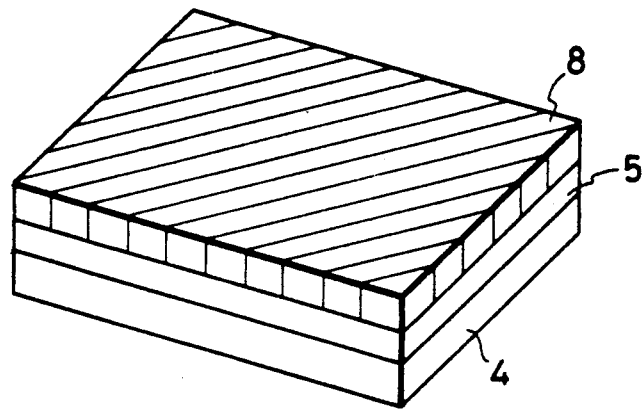
Figure 2A:
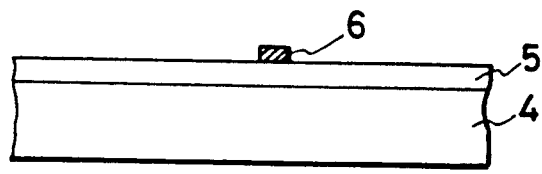
FIGS. 2A-2D illustrate diagramatically the steps showing the first embodiment of the method for forming crystals according to the present invention.
Figure 2B:
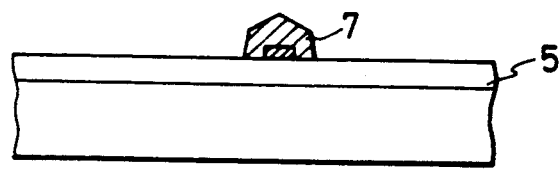
Figure 2C:
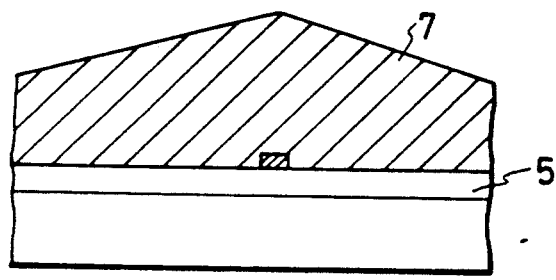
Figure 2D:
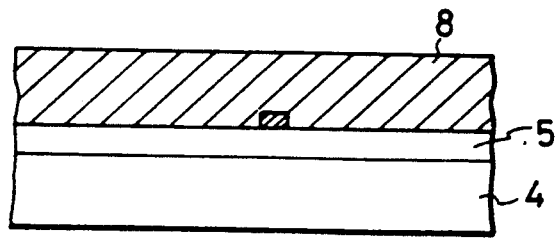
Figure 4A:
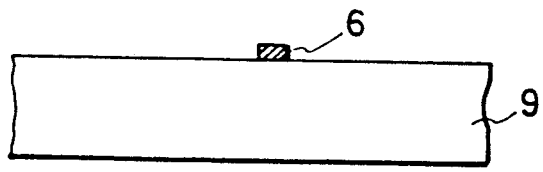
FIGS. 4A-4D illustrate diagramatically the steps showing the second embodiment of the present invention.
Figure 4B:
Figure 4C:
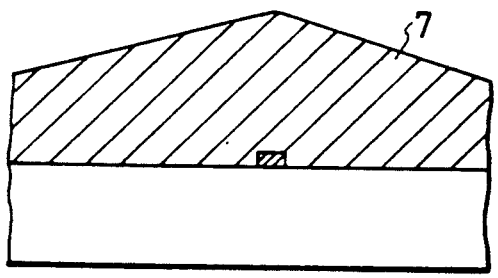
Figure 4D:
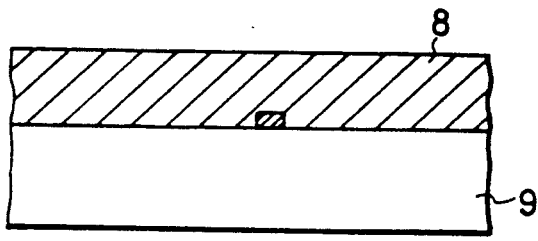

FIGS. 2A–2D illustrate diagramatically the steps for illustration of the first embodiment of the method for forming crystals according to the present invention, and FIGS. 3A and 3B are perspective views of FIGS. 2A and 2D.

First, as shown in FIGS. 2A and 3A, on the substrate 4, a nonnucleation surface 5 with small nucleation density is formed, and a material with larger nucleation density is thinly deposited thereon, followed by patterning by lithography, etc. to form a nucleation surface 6 sufficiently finely such that only a single nucleus may be formed to obtain a substrate for crystal formation. However, the size, the crystal structure and the composition of the substrate 4 may be as desired, and it may be a substrate having a functional device formed thereon. Also, the nucleation surface 6 is inclusive of modified regions having excessively Si, N, etc. formed by ion implantation of Si, N, etc. on the thin film 5, as described above.

Next, the substrate 4 having the nonnucleation surface 5 and the nucleation surface 6 is dipped into a solution containing a material for crystal formation as a crystal forming treatment, thereby forming a single nucleus on the nucleation surface 5 to allow a monocrystal to grow from the single nucleus.

In this embodiment, the above crystal forming treatment is carried out using a device for liquid-phase growth as shown in FIG. 1, and the substrate for crystal formation mentioned above is dipped into a solution comprising the mixture of a metal solvent and a solute of crystal forming material while the solution temperature is controlled to keep the supersaturated state of the solute, thereby depositing a monocrystal on the nucleation surface. In this crystal growth, it is desirable to cool gradually at a cooling rate of 0.6° C./min or lower in case of gradually cooling. Since the nucleation surface 6 is formed sufficiently finely, only a single nucleus is formed and a monocrystal grows from the single nucleus as the growing center.

In this embodiment, Si monocrystalline wafer is used as the substrate 4 and the nonnucleation surface 5 comprising $SiO_2$ amorphous film is formed by thermal oxidation of the surface of said wafer. Of course, a quartz substrate may be employed, or alternatively $SiO_2$ layer may be formed as the nonnucleation surface on the surface of any desired substrate such as metal, semi-conductor, magnetic material, piezoelectric material, insulator, etc. by use of the sputtering method, the CVD method, the vacuum vapor deposition method, etc. As the material constituting the nonnucleation surface, $SiO_2$ is desirable, but $SiO_x$ ($0 < x \leq 2$) with various x values may be also employed.

On the $SiO_2$ film 5 thus formed, a silicon nitride layer (here $Si_3N_4$ layer) is deposited by the reduced pressure vapor deposition method, followed by patterning of the silicon nitride layer according to conventional lithographic technique to form finely the nucleation surface 6 of preferably 10 μm or less in area, more preferably 5 μm or less, most preferably 1 μm or less, thus giving a substrate. The substrate is dipped into the solution containing materials for formation of crystals and the treatment for formation of crystals is performed. Subsequently, only a single nucleus is formed on the nucleation surface 6. The single nucleus grows while maintaining a monocrystalline structure to become a monocrystalline grain 7 shaped in an island as shown in FIG. 2B. For the island-shaped monocrystalline grain 7 to be formed, it is desirable to determine the crystal forming treatment conditions so that no nucleation may occur at all on the nonnucleation surface 5.

The island-shaped monocrystalline grain 7 further grows while maintaining the monocrystalline structure with the nucleation surface 6 as the center, whereby the nonnucleation surface 5 becomes wholly covered therewith as shown in FIG. 2C.

Subsequently, the surface of the monocrystalline grain 7 is flattened by etching or polishing to form a monocrystalline layer 8 on which a desired device can be formed, as shown in FIG. 2D and FIG. 3B. Thus, when the nonnucleation surface 5 is formed on the substrate 4, any desired material can be used the substrate 4 which becomes the supporting member. Further, even if the substrate 4 is one having a functional device, etc. formed thereon, a monocrystalline layer can be easily formed thereon.

Further, in the present invention, the so-called "meltback phenomenon", i.e. dissolution of the portion of monocrystalline substrate material itself in contact with the solution, which has been a problem involved in the conventional selective epitaxial growth (SEG) using a monocrystal and $SiO_2$, etc. does not present a problem since the nucleation surface 6 comprising silicon nitride and silicon oxide is formed by ion implantation of Si, N, etc.

Still further, in the present invention, deposition is effected under the conditions extremely close to thermal equilibrium with the degree of supersaturation of crystal material in the solution kept small, thus resulting in formation of a monocrystal of good quality containing no crystal defect, etc.

Furthermore, since a small quantity of the solvent used for liquid phase crystal forming treatment is incorporated into the crystal, a crystal of desired conduction type, i.e. p-type, i-type or n-type, can be formed. In particular, relatively high level of doping can be performed in comparison with the crystal forming treatment in vapor phase.

In the present invention, a Group III metal such as Ga, In, etc. may be used as a solvent for forming a p-type crystal to thereby enhance the carrier density as the following.

Solvent: Ga
Growth temperature: 300°–950° C.
Carrier density: $3 \times 10^{18} - 5 \times 10^{20}$ cm$^{-3}$
Solvent: In
Growth temperature: 700°–980° C.
Carrier density: $1 \times 10^{15} - 4 \times 10^{17}$ cm$^{-3}$ In the present invention, a Group V metal such as Sb, Bi, etc. may be used as a solvent for forming an n-type crystal to thereby enhance the carrier density as the following.

Solvent: Sb
Growth temperature: 640°–800° C.
Carrier density: $3 \times 10^{19} - 3 \times 10^{20}$ cm$^{-3}$
Solvent: Bi
Growth temperature: 800°–1000° C.
Carrier density: $1 \times 10^{16} - 6 \times 10^{16}$ cm$^{-3}$ Also, a Group IV metal may be used as a solvent for forming an i-type crystal to thereby obtaining the carrier density as the following.

Solvent: Sn
Growth temperature: 800°–1000° C.
Carrier density: $1 \times 10^{15} - 1 \times 10^{16}$ cm$^{-3}$ Thus, for example, when Ga is used as the solvent, electrically active crystals are obtained. On the other hand, when Sn is used as the solvent, any appropriate desired impurity can be added later to the crystal obtained, and a crystal determined in conductive type is formed with desired doping concentration.

Therefore, it is optimum when application to a semiconductor device is considered.

In the above embodiment, the crystal forming surface is formed of a thin film, but of course as shown in FIGS. 4A–4D, the monocrystalline layer may be formed similarly by using the substrate comprising a material with small nucleation density enabling selective monocrystal growth as such.

FIGS. 4A–4D illustrate diagramatically the second embodiment of the present invention. As shown in these Figures, by forming a nucleation surface 6 sufficiently finely on the substrate 9 comprising a material with small nucleation density enabling selective nucleation, a monocrystalline layer 8 can be formed similarly as in the first embodiment.

Figure 5A:
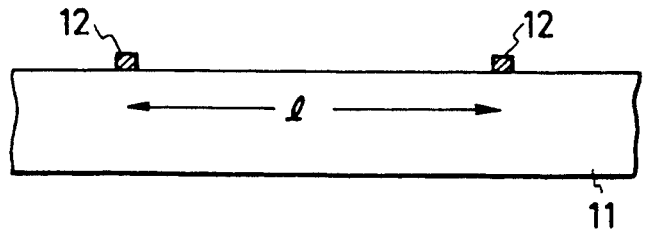
FIGS. 5A-5D illustrate diagramatically the steps showing the third embodiment of the present invention.
Figure 5B:
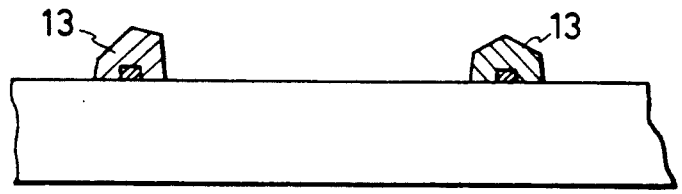
Figure 5C:
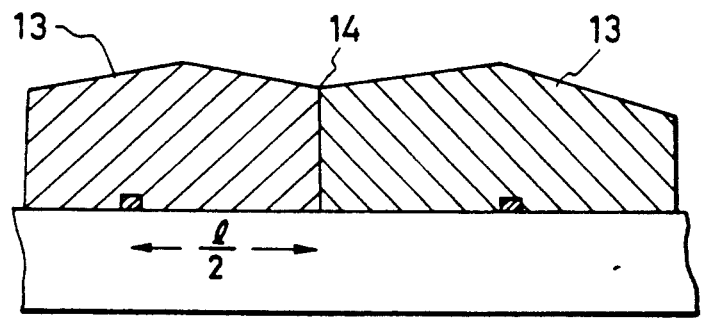
Figure 5D:
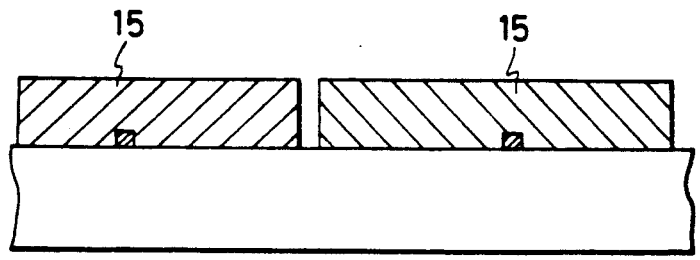
Figure 6A:
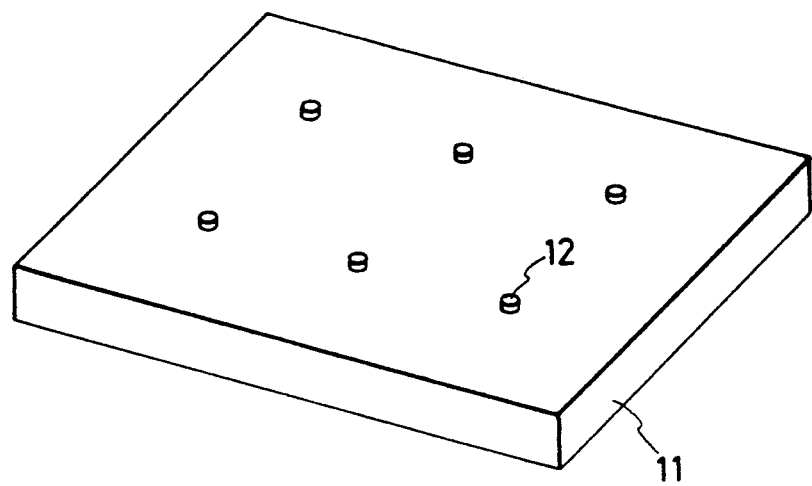
FIGS. 6A and 6B are perspective views of FIGS. 5A and 5D.
Figure 6B:
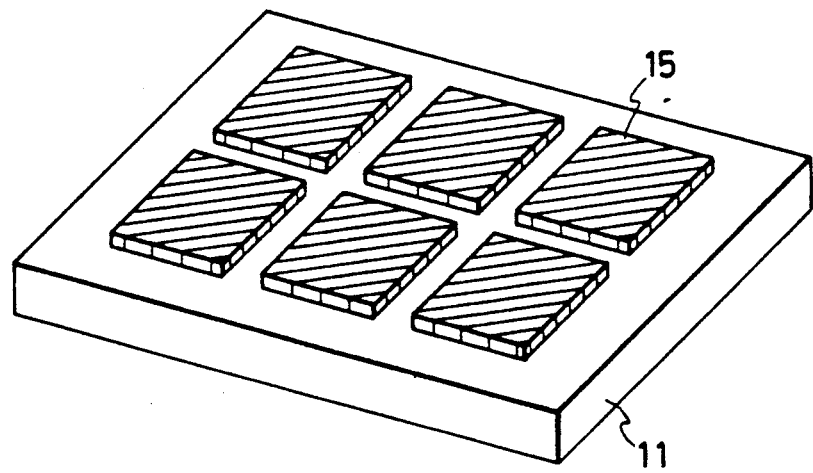
Figure 7A:
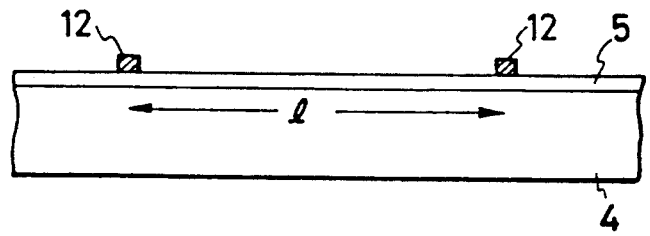
FIGS. 7A-7D illustrate diagramatically the steps showing the fourth embodiment of the present invention.
Figure 7B:
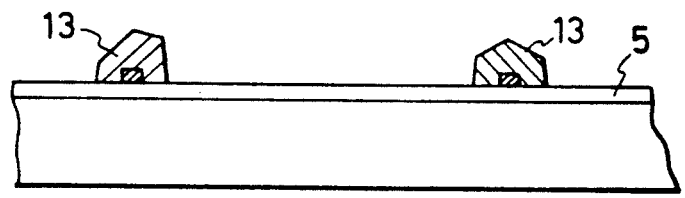
Figure 7C:
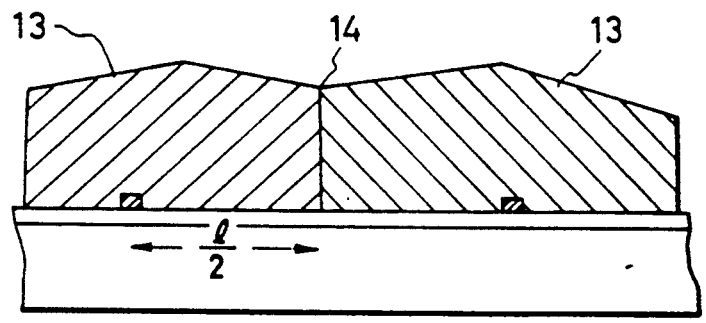
Figure 7D:
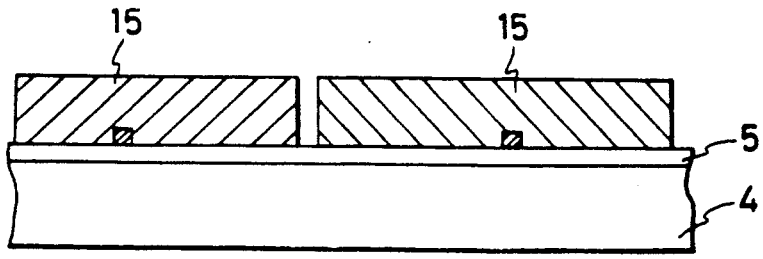

FIGS. 5A–5D illustrate diagramatically the third embodiment of the method of forming crystals according to the present invention, and FIGS. 6A and 6B are perspective views in FIGS. 5A and 5D.

As shown in FIG. 5A and FIG. 6A, the nucleation surface 12 is arranged on the amorphous insulating substrate 11 of sufficiently small size with a distance l from neighboring surfaces 12. The distance l is set equal to or greater than the size of the monocrystalline region required for formation of a semiconductor device.

Next, only a single nucleus of a crystalline material is formed on the nucleation surface 12 under similarly appropriate crystal forming treatment in liquid phase as in the above first embodiment. In other words, the nucleation surface 12 is required to be formed sufficiently finely to the extent that only a single nucleus may be formed. The size of the nucleation surface 12, which may differ depending on the kind of the material, may be within the above range. Further, when crystal growth treatment is performed in liquid phase, the nucleus grows while maintaining the monocrystalline structure, to become an island-shaped monocrystalline grain 13 as shown in FIG. 5B. For the island-shaped monocrystalline grain 13 to be formed, as already described, it is necessary to determine the conditions so that no nucleation occurs at all on the substrate 11.

The crystal orientation in the direction of the island-shaped monocrystalline grain 13 normal to the substrate is determined constant so as to make the interfacial energy between the material of substrate 11 and the thin film depositing material minimum. For example, the surface or interfacial energy has anisotropy depending on the crystal face.

The island-shaped monocrystalline grain 13 further grows to contact the adjacent monocrystalline grain 13 as shown in FIG. 5C, and a crystal grain boundary 14 is formed almost at the intermediate position of the nucleation surface 12.

Subsequently, the monocrystalline grain 13 grows three-dimensionally, but since the crystal face with slow growth speed appears as a facet, the surface is flattened by etching or polishing, and further the portion of the grain boundary 14 is removed to form a thin film 15 of monocrystal containing no grain boundary in shape of a lattice as shown in FIG. 5D and FIG. 6B. The size of the monocrystalline thin film 15 is determined by the interval between the different materials 12 as described above. In other words, by determining the formed pattern of the different kind of material 12 appropriately, the position of the grain boundary can be controlled to form monocrystals with desired sizes at a desired arrangement.

FIGS. 7A–7D illustrate diagramatically the steps showing the fourth embodiment of the present invention. As shown in the same Figure, on a desired substrate 4 similarly as in the first embodiment, a nonnucleation surface 5 comprising a material with small nucleation density enabling selective monocrystal growth is formed, and nucleation surface 12 is formed with intervals of l thereon, whereby a monocrystalline layer 15 can be formed similarly as in the above third embodiment.

Figure 8A:
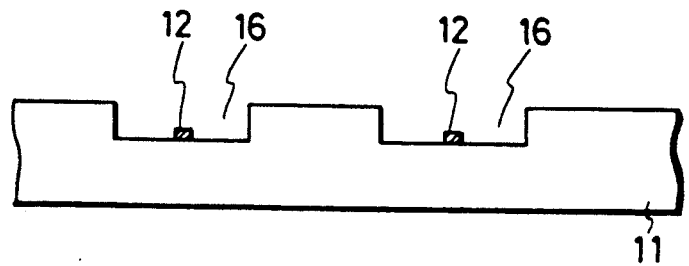
FIGS. 8A-8C illustrate diagramatically the steps showing the fifth embodiment of the method for forming crystals according to the present invention.
Figure 8B:
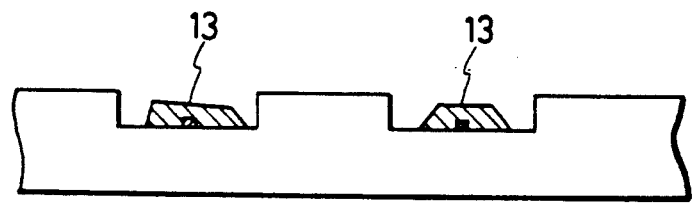
Figure 8C:
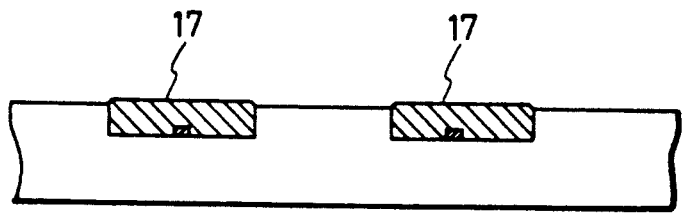
Figure 9A:
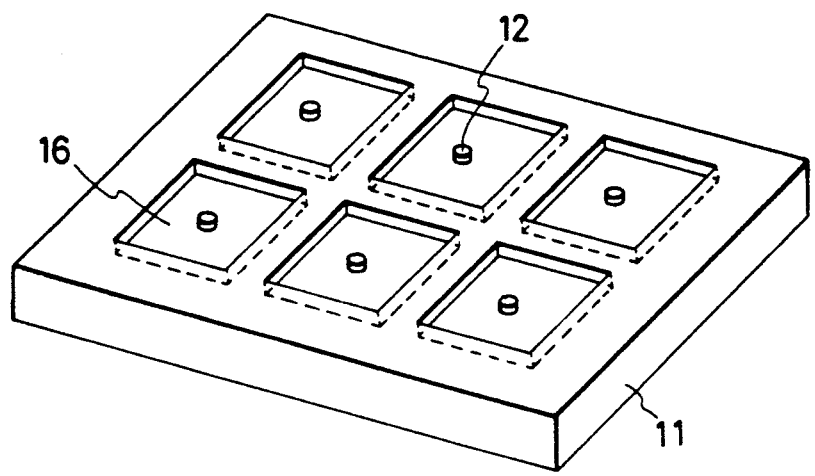
FIGS. 9A and 9B are perspective views of FIGS. 8A and 8C.
Figure 9B:
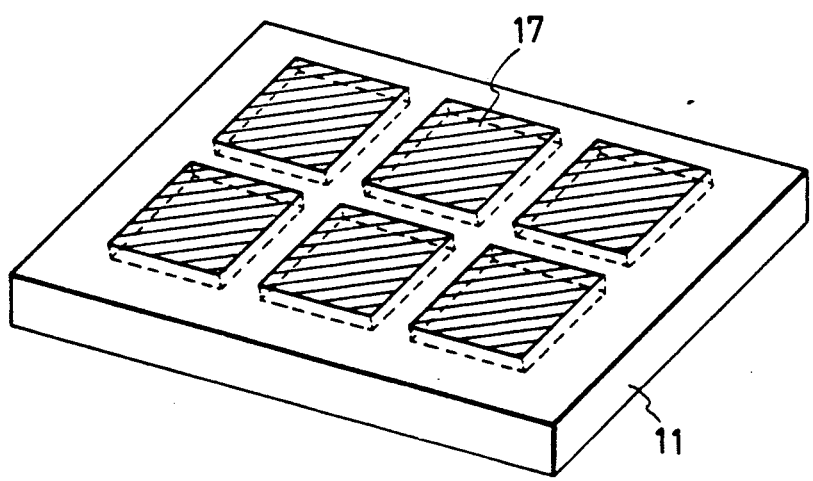

FIGS. 8A-8C illustrate diagramatically the formation steps showing the fifth embodiment of the method of forming crystals according to the present invention, and FIGS. 9A and 9B are perspective views in FIGS. 8A and 8C.

First, as shown in FIG. 8A and FIG. 9B, a concavity 16 with necessary size and shape is formed on the amorphous insulating substrate 11, and the nucleation surface 12 with fine size is formed therein.

Subsequently, as shown in FIG. 8B, an island-shaped monocrystalline grain 13 is permitted to grow similarly as in the first embodiment.

And, as shown in FIG. 8C and FIG. 9B, the monocrystalline grain 13 is permitted to grow until filling the concavity 16, thus forming a monocrystalline layer 17.

In this embodiment, since the monocrystalline grain 13 grows in the concavity 16, the steps of flattening and removing grain boundary portions become unnecessary.

Figure 10A:
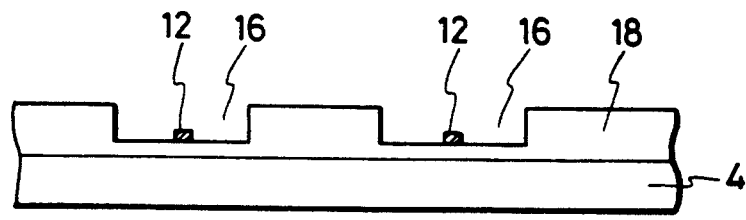
FIGS. 10A-10C illustrate diagramatically the steps showing the sixth embodiment of the present invention.
Figure 10B:
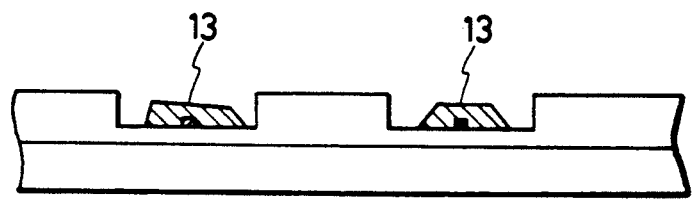
Figure 10C:
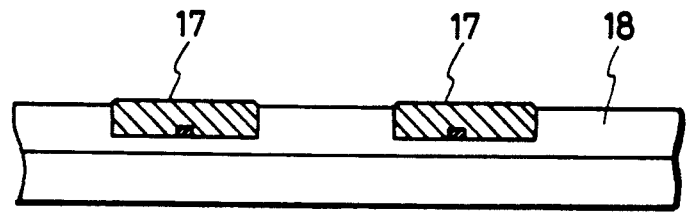

FIGS. 10A-10C illustrate diagramatically the sixth embodiment of the present invention. As shown in these Figures, on any desired substrate 4 similarly as in the first embodiment, a thin film 18 which becomes a non-nucleation surface comprising a material with small nucleation density enabling selective deposition is formed, and a concavity 16 with necessary size and shape is formed thereon. And, the nucleation surface 12 is formed finely therein, and a monocrystalline layer 17 is formed similarly as in the fifth embodiment.

Figure 11A:
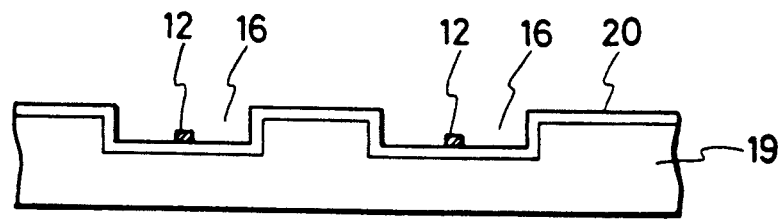
FIGS. 11A-11C illustrate diagramatically the steps showing the seventh embodiment of the present invention.
Figure 11B:
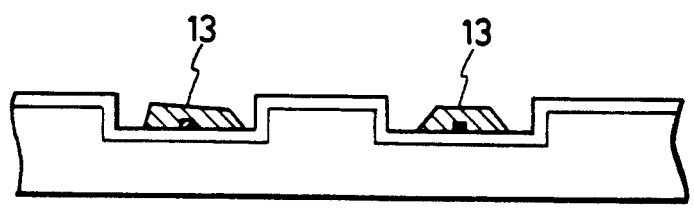
Figure 11C:
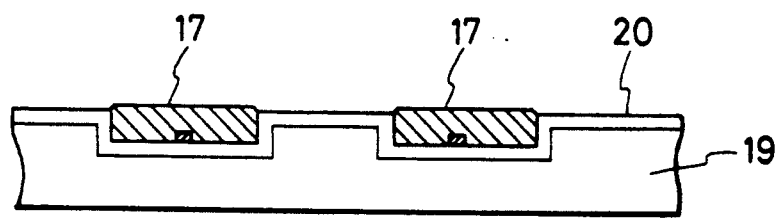

FIG. 11A-11C illustrate diagramatically the formation steps showing the seventh embodiment. After formation of a concavity on a desired substrate 19, a thin film 20 which becomes a nonnucleation surface comprising a material with small nucleation density enabling selective deposition is formed, and following the same procedure as described above, a monocrystalline layer 17 can be formed.

Figure 12:
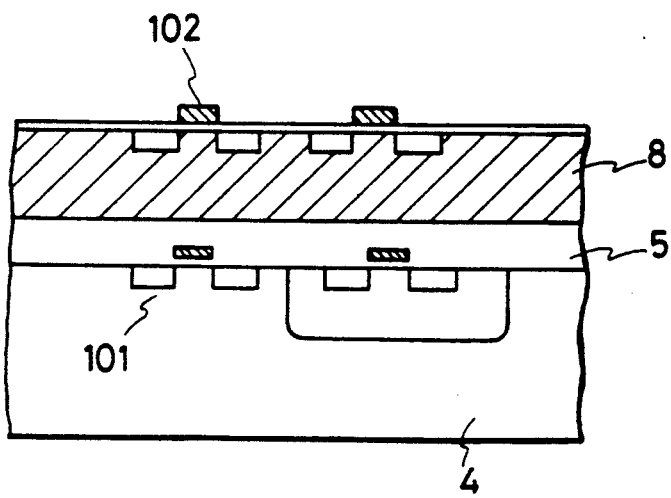
FIG. 12 is a schematic sectional view showing an example of the multi-layer structure prepared by use of the first embodiment of the present invention.

FIG. 12 is a schematic sectional view showing an example of the multi-layer structure prepared by use of the first embodiment of the present invention.

In the same Figure, on the substrate 4 of Si or GaAs, a transistor 101 or other semiconductor device or optical device, etc. is formed according to the conventional production process, and an $SiO_2$ layer 5 as the nonnucleation surface is formed thereon according to the CVD method or the sputtering method. And, as already described, a monocrystal is permitted to grow on a sufficiently fine nucleation surface, thereby forming a monocrystalline layer 8.

Subsequently, a transistor 102 or other semiconductor device or optical device is formed on the monocrystalline layer 8 and connected through the $SiO_2$ layer 5. Thus, for example, when CMOS is formed by connecting the MOS transistor 101 of the first layer and the MOS transistor 102 of the second layer, CMOS without mutual interaction at all can be prepared. Also, its driving circuit can be integrated with an emitting device to accomplish high integration.

Further, by repeating formation of monocrystalline layer, monocrystalline layers 8 can be formed in many layers with $SiO_2$ layer 5 sandwiched therebetween to form easily a multi-layer structure.

FIGS. 13A-13D illustrate diagramatically the formation steps of the eighth embodiment of the present invention.

Figure 13A:
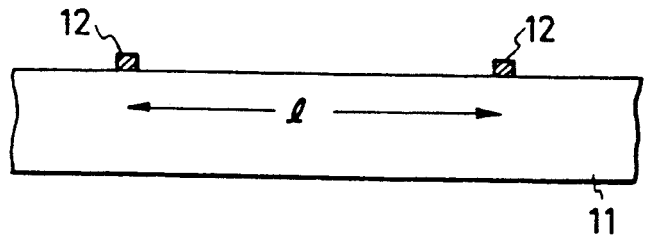
FIGS. 13A-13D illustrate diagramatically the steps showing the eighth embodiment of the present invention.
Figure 13B:
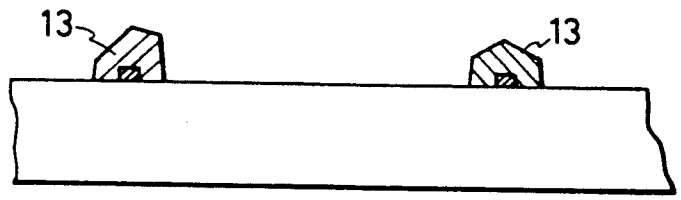
Figure 13C:
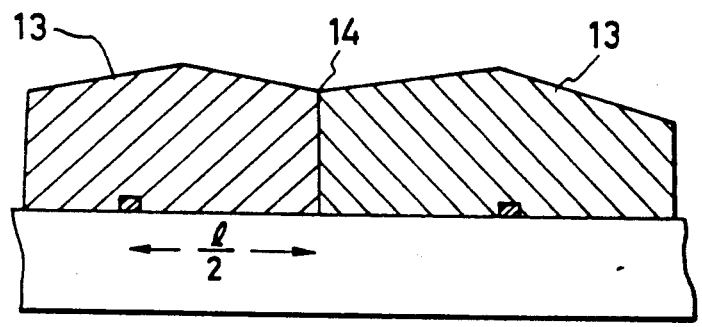
Figure 13D:
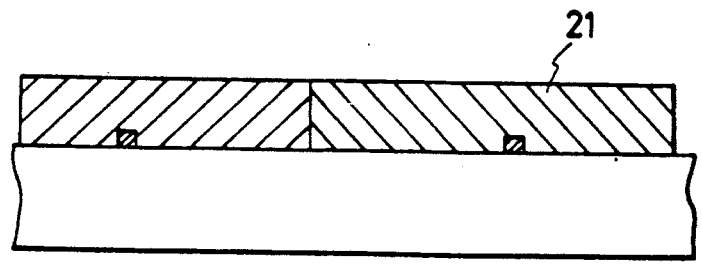

FIGS. 13A-13C are the same as FIGS. 5A-5C. That is, the nucleation surface 12 is formed with interval l to form monocrystalline grain 13. By this, the grain boundary 14 is formed at substantially the center of the nucleation surface 12, and a polycrystalline layer 21 with a grain size l as shown in FIG. 13D can be obtained.

Since the grain size of the polycrystalline layer 21 can be determined by the interval l between the nucleation surface 12, it becomes possible to control the grain size. In the prior art, the grain size of polycrystal was varied depending on a plural number of factors such as the formation method, the formation temperature, etc., but according to the present invention, it can be determined with good controllability by the interval l between the nucleation surface 12.

The above polycrystalline layer 21 may be also formed by forming a depositing surface material layer 5 with small nucleation density on a desired substrate 4. In this case, as already described, the polycrystalline layer can be formed without restriction to the substrate, the material, etc. of the substrate.

Formation of Nucleation Surface by Difference of Composition of Silicon Nitride

For obtaining sufficient nucleation density difference between the non-nucleation surface and the nucleation surface, the material is not limited to $Si_3N_4$, but it may be also a silicon nitride with its composition being varied.

According to the plasma CVD method, in which a silicon nitride film is formed at low temperature by decomposing $SiH_4$ gas and $NH_3$ gas in RF plasma, by varying the flow rate ratio of $SiH_4$ gas to $NH_3$ gas, the composition ratio of Si to N in the silicon nitride film deposited can be varied to great extent.

For example, as the deposition conditions, if RF output is set at 175 W, the substrate temperature at 380° C. and $SiH_4$ gas flow rate is fixed at 300 cc/min., when the gas flow rate ratio of $NH_3/SiH_4$ is varied from 4 to 10 by varying the flow rate of $NH_3$ gas, it has been found by the Auger's electron spectroscopy that the Si/N ratio in the silicon nitride film is varied from 1.1 to 0.58.

On the other hand, the composition of the silicon nitride film formed by introducing $SiH_2Cl_2$ gas and $NH_3$ gas under the conditions of a reduced pressure of 0.3 Torr and a temperature of about 800° C., was found to be approximately to $Si_3N_4$ (Si/N=0.75) which is the stoichiometric ratio.

The silicon nitride film formed by the heat treatment of Si in ammonia or $N_2$ at about 1200° C. (the hot nitriding treatment) can be obtained with a composition further approximate to the stoichiometric ratio, because its formation method is performed under thermal equilibrium.

When the above nucleus of Si is grown by using silicon nitrides formed according to the various methods as described above as the deposition surface material with nucleation density of Si higher than $SiO_2$, difference in nucleation density is created depending on its composition.

Therefore, it is necessary to select the nucleation density and the optimum size of silicon nitride capable of selecting a single nucleus.

Formation of Nucleation Surface by Ion Implantation

As the method for realizing the nucleation density difference relative to Si, ion implanation of Si, N, P, B, F, Ar, He, C, As, Ga, Ge, etc. may be effected locally onto the surface of $SiO_2$ which is the material with lower nucleation density to form a modified region on the non-nucleation surface, and the modified region may be utilized as the nucleation surface with higher nucleation density.

For example, the $SiO_2$ surface is covered with a resist, and the desired sites are exposed to light, developed and dissolved to have the $SiO_2$ surface partially exposed.

Subsequently, by use of $SiF_4$ gas as the source gas, Si ions are implanted onto the $SiO_2$ surface at 10 keV at a density of $1 \times 10^{16}$ to $1 \times 10^{18}$ cm$^{-2}$. The projected flight length is 114 Å, and Si concentration reaches ca. $10^{22}$ cm$^{-3}$ on the $SiO_2$ surface. When $SiO_2$ is amorphous, the region implanted with Si ions is also amorphous.

For formation of the modified region, ion implantation can be effected with a resist as the mask, but narrowed Si ions may be also implanted onto the $SiO_2$ surface by use of the converging ion beam technique without use of the resist mask.

After having effected thus ion implantation, by peeling off the resist, a modified region with excessive Si is formed as a nucleation surface on the $SiO_2$ surface.

Here, by forming sufficiently minutely the modified region, a single nucleus of Si can be grown with the modified region as the nucleation surface whereby a single crystal can be grown as described above.

Formation of the modified region sufficiently finely to the extent that a single nucleus can be grown can be accomplished by patterning of the resist or narrowing the beam of the converging ion beam.

Formation of Nucleation Surface by Window Opening

As another method for realizing the nucleation density difference to Si, the whole surface may be once formed with a nucleation surface forming material, then a layer of non-nucleation surface forming material such as $SiO_2$, etc. formed on said nucleation surface forming material, and a fine window opened by etching at a desired portion of said non-nucleation surface forming material layer, to have the nucleation surface exposed as fine region from said window. As the nucleation surface forming material and the non-nucleation surface forming material, the same as those described above can be used.

Crystal Growth of Materials Other Than Si (1) GaAs

Similarly as in the case of Si crystal formation as described above, GaAs crystals can be formed. More specifically, a nucleation surface is formed by ion implantation of Ga ions, As ions, Si ions, etc. at $1 \times 10^{15}$ cm$^{-2}$ or higher in the fine regions on the $SiO_2$ surface. Alternatively, a silicon nitride film may be formed in fine regions of the $SiO_2$ surface, and its surface may be made the nucleation surface. When Ga is employed as the solvent, and cooling is carried out at a temperature of 700° to 800° C. at a rate of 0.15° to 0.2° C./min., growth of GaAs crystals occurs.

(2) InGaAs

Similarly as in the case of Si crystal formation as described above, InGaAs crystals can be formed. More specifically, a nucleation surface is formed by ion implantation of In ions, Ga ions, As ions, etc. in fine regions of the $SiO_2$ surface at $1 \times 10^{15}$ cm$^{-2}$ or more. Alternatively, a silicon nitride film may be formed in fine regions of the $SiO_2$ surface, and its surface may be utilized as the nucleation surface. When Ga is used as the solvent, and cooling is carried out at a temperature of 500° to 600° C. at a rate of 0.1° to 0.3° C./min., InGaAs crystals will grow.

According to the present invention as described above, the base substrate may be a substrate of a material capable of forming the above material layer, which becomes non-nucleation surface whereby the scope of selection can be broadened to great extent, whereby lowered cost and enlarged area can be accomplished with ease.

The combinations of the material constituting a non-nucleation surface, the material constituting a nucleation surface and the crystalline material as described above are not limited to those shown in the above embodiments, but combinations of materials having sufficient nucleation density difference are clearly available. Therefore, also in the case of compound semiconductors such as InP, etc. capable of growth, monocrystals, monocrystal groups or polycrystals controlled in grain size can be formed.

EXAMPLE 1

At the surface of a 5 inch Si monocrystal wafer was formed an $SiO_2$ layer of about 2000 Å thick as a non-nucleation surface.

The thus obtained substrate was set in a reduced pressure vapor phase growth device, and an $Si_3N_4$ layer was formed on the $SiO_2$ layer at a thickness of 300 Å under the deposition conditions of:

Pressure: 0.3 Torr
Gas used: $SiH_2Cl_2 + NH_3$ (mixed gas)
Flow rate ratio: $NH_3/SiH_2Cl_2 = 6$
Substrate temperature: 800° C.

Next, the above $Si_3N_4$ layer was patterned by the lithography technique to form fine $Si_3N_4$ regions as nucleation surfaces arranged in a matrix of 1 μm size, 150 μm pitch and $50 \times 100$ arrangement (as shown in FIG. 5A and FIG. 6A).

Then, on the Si monocrystal wafer having on its surface the nonnucleation surface of $SiO_2$ and the nucleation surfaces of $Si_3N_4$ in the $50 \times 100$ arrangement, Si monocrystals were formed by liquid phase crystal forming treatment under the following Si monocrystal forming conditions.

Solvent: Sn
Solute: Si (saturation amount at 900° C.)
Growth temperature: 900° C.–864° C.
Cooling rate: 0.4° C./min
Time: 1.5 hrs The Si monocrystal wafer subjected to crystal forming treatment was taken out of the device, and the crystal evaluation was performed by electronmicroscope observation and X-ray diffraction. As a result, it was found that $50 \times 100$ Si monocrystals having a grain size of 80 μm with an extremely narrow distribution were formed. It was also found that these Si monocrystals all had excellent monocrystalinity.

EXAMPLE 2

An Si polycrystal was formed under similar conditions to Example 1. The surface of the polycrystal layer was subjected to flattening treatment by the selective etching technique employed conventionally in the art of semiconductor.

Using the Si polycrystal of which surface was flattened as above, a p MOS transistor was fabricated according to the method used conventionally in the art of semiconductor, and the operation characteristics thereof were investigated. As a result, it was found that the characteristics were remarkably excellent as compared to a p MOS transistor fabricated by using an Si polycrystal layer obtained by the conventional method.

As described in detail above, the crystals and the method of producing the same according to the present invention, by forming on a substrate surface a nucleation surface forming material with sufficiently greater nucleation density than the material of said surface portion sufficiently finely so that a single nucleus may grow, permit a monocrystal from said nucleation surface with said substrate surface as the nonnucleation surface and the surface comprising the different kind of material as the nucleation surface, whereby crystals such as monocrystals with necessary sizes, a plural number of island-shaped monocrystals and polycrystals controlled in grain size, etc. can be easily formed on the base substrate. Moreover, they can be formed by use of a device conventionally used in semiconductor process without requiring a special production device.

Also, the crystals of the present invention are not restricted in the materials for the base substrate, and therefore three-dimensional integration, enlargement of area and lowered cost can be easily accomplished. For example, since monocrystals or polycrystals of silicon which are primary materials of semiconductor devices can be easily formed on an amorphous insulating material, multi-layer formation of devices with excellent electrical characteristics can be accomplished to realize a multi-functional integrated circuit not found in the prior art. Specifically, integration of optical device, surface acoustic device, piezoelectric device, etc. or integration of each thereof with surrounding circuit C, etc. can be realized. Also, if inexpensive glass or ceramics, etc is used as the substrate material, application to a large area electronic device such as large scale flat panel display, etc. with the driving circuit integrated in one sheet of glass, etc. will become possible.

Further, the present invention, by forming the above nucleation surface forming materials with desired distance on the deposited surface, can form monocrystals with necessary sizes on a plurality of sites, whereby the formation steps can be simplified to great extent and also the formation time shortened as compared with the melting and solidification method which forms monocrystals by irradiation of laser or electron beam.

Also, by controlling the intervals between the nucleation surface forming materials formed on the above deposition surface, a polycrystal with grain sizes controlled by the interval can be formed. The method of forming polycrystals has better controllability in grain size and also the forming speed is shortened to great extent, as compared with the prior art method in which polycrystals with large grain sizes are formed according to the above melting and solidification method.

Further, according to the present invention, since crystal formation is effected in liquid phase, crystals of good quality substantially without crystal defect can be obtained.

I claim:

1. A method of forming a crystal which comprises the steps of: providing a substrate having (i) a non-nucleation of an amorphous surface material with a small nucleation density and (ii) a nucleation surface of an amorphous material which is a material different from the material of the non-nucleation surface and having a larger nucleation density than the material of said nonnucleation surface, said nucleation surface having an area which is sufficiently fine enough to form only a single nucleus from which a monocrystal is grown;

dipping said substrate in a solution containing a monocrystal-forming material, thereby initiating crystal growth at said single nucleus while in said monocrystal-forming material solution.

2. A method as defined in claim 1 wherein the material constituting said nucleation surface is formed sufficiently finely by deposition on the material constituting said nonnucleation surface followed by patterning.

3. A method as defined in claim 1 wherein the material constituting said nucleation surface is formed sufficiently finely by ion implantation to the material constituting said nonnucleation surface.

4. A method as defined in claim 1 wherein the material constituting said nonnucleation surface is formed on a base substrate.

5. A method as defined in claim 1 wherein said nucleation surface is formed in plurality and the grain size is controlled by the distance between the nucleation surfaces.

6. A method as defined in claim 1 wherein said solution comprises a metal solvent and a solute comprising a material containing the constituting element of said crystal.

7. A method as defined in claim 6 wherein said metal solvent comprises a Group III metal.

8. A method as defined in claim 6 wherein said metal solvent comprises a Group IV metal.

9. A method as defined in claim 6 wherein said metal solvent comprises a Group V metal.

10. A method as defined in claim 1 wherein said crystal forming treatment involves deposition of a solute comprising the material of said crystal due to supersaturation.

11. The method as defined in claim 1 wherein the material constituting said nucleation surface is silicon nitride.

12. The method as defined in claim 1 wherein the material constituting said nonnucleation surface is silicon oxide.

13. The method defined in claim 1 wherein said substrate has a plurality of nucleation surfaces.

* * * * *

UNITED STATES PATENT AND TRADEMARK OFFICE
CERTIFICATE OF CORRECTION

PATENT NO. : 5,254,211
DATED : October 19, 1993
INVENTOR(S) : TAKAO YONEHARA

It is certified that error appears in the above-identified patent and that said Letters Patent is hereby corrected as shown below:

COLUMN 2

Line 17, "an" should read --and--.

COLUMN 3

Line 21, "simple" should read --a simple--.
Line 34, "applications" should read --applications,--.

COLUMN 5

Line 19, "N, etc." should read --Si, N, etc.--.
Line 42, "FIG. 31" should read --Figure, 31--.
Line 58, "diagramatically" should read --diagrammatically--.

COLUMN 6

Line 6, "excessively" should read --excessive amounts of--.
Line 68, "FIG. 3B.  Thus," should read --FIG. 3B. ¶ Thus,--.

COLUMN 7

Line 2, "used the" should read --used for the--.
Line 49, "obtaining" should read --obtain--.

COLUMN 12

Line 55, "monocrystalinity." should read --monocrystallinity.--.

UNITED STATES PATENT AND TRADEMARK OFFICE
CERTIFICATE OF CORRECTION

PATENT NO. : 5,254,211
DATED : October 19, 1993
INVENTOR(S) : TAKAO YONEHARA

It is certified that error appears in the above-identified patent and that said Letters Patent is hereby corrected as shown below:

COLUMN 13

Line 33, "etc" should read --etc.--.

COLUMN 14

Line 6, "tion of an amorphous surface" should read
--tion surface of an amorphous--.

Signed and Sealed this

Twelfth Day of July, 1994

Attest:

BRUCE LEHMAN

Attesting Officer          Commissioner of Patents and Trademarks